US007764089B2

(12) United States Patent
Iwabuchi et al.

(10) Patent No.: US 7,764,089 B2

(45) Date of Patent: Jul. 27, 2010

(54) DEVICE FOR DRIVING SWITCHING ELEMENTS

(75) Inventors: Akio Iwabuchi, Saitama (JP); Ryuichi Furukoshi, Saitama (JP); Yoichi Kyono, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 604 days.

(21) Appl. No.: 11/577,201

(22) PCT Filed: Sep. 20, 2005

(86) PCT No.: PCT/JP2005/017309

§ 371 (c)(1),
(2), (4) Date: Apr. 13, 2007

(87) PCT Pub. No.: WO2006/043391

PCT Pub. Date: Apr. 27, 2006

(65) Prior Publication Data

US 2009/0045851 A1 Feb. 19, 2009

(30) Foreign Application Priority Data

Oct. 22, 2004 (JP) ............................ 2004-307987

(51) Int. Cl.
*H03K 3/00* (2006.01)

(52) U.S. Cl. ...................................... 327/108; 327/109

(58) Field of Classification Search ................ 327/108, 327/109, 112

See application file for complete search history.

(56) References Cited

U.S. PATENT DOCUMENTS

| | | | | |
|---|---|---|---|---|
| 6,326,831 | B1 | 12/2001 | Kumagai | |
| 6,529,061 | B1 * | 3/2003 | Orita | 327/381 |
| 6,734,706 | B2 | 5/2004 | Yoshida et al. | |

FOREIGN PATENT DOCUMENTS

| | | |
|---|---|---|
| JP | 2-182014 | 7/1990 |
| JP | 4230117 | 8/1992 |

* cited by examiner

*Primary Examiner*—Lincoln Donovan
*Assistant Examiner*—Ryan C Jager
(74) *Attorney, Agent, or Firm*—Bachman & LaPointe, P.C.

(57) ABSTRACT

A device for driving switching elements is provided with a potential detector 29 which provides drive circuit 30 with signals in response to differences among potentials at junctions 17 to 20 of first and third resistors 13, 15, third resistor 15 and first control MOS-FET 8, second and fourth resistors 14, 16 and fourth resistor 16 and second control MOS-FET 9 so that drive circuit 30 supplies drive signals to a gate terminal of a first MOS-FET 1 based on potentials in first and second series circuits 11 and 12. When appropriate resistance values are selected for first to fourth resistors 13 to 16, potential detector 29 precisely detects the potential at each junction 17 to 20 to produce detection signals and prevent malfunction of drive circuit 30 even upon occurrence of abnormal signals or noises resulted from abrupt potential rise.

7 Claims, 6 Drawing Sheets

DEVICE FOR DRIVING SWITCHING ELEMENTS

FIELD IN INDUSTRY

This invention relates to a driving device capable of performing the on-off operation of switching elements without malfunction of these elements for reliable operation of the driving device.

BACKGROUND

For example, a driving device for use in a power device such as a resonant converter or motor driver, comprises as shown in FIG. 6, a DC power source 3, first and second MOS-FETs 1 and 2 connected to DC power source 3 to be alternately turned on and off; an electric load 4 connected between a junction 6 of first and second MOS-FETs 1 and 2 and DC power source 3; a first control circuit 5 connected to a control or gate terminal of first MOS-FET 1; and a second control circuit 50 connected to a control or gate terminal of second MOS-FET 2 to form a half-bridge circuit in conjunction therewith. First control circuit 5 comprises a control DC power source 10; a first series circuit 11 which includes a first resistor 13 and a first control MOS-FET 8 connected in series to control DC power source 10; a second series circuit 12 which includes a second resistor 14 and a second control MOS-FET 9 connected in parallel to first series circuit 11 and in series to control DC power source 10; a drive signal generator 7 for forwarding drive signals to control or gate terminals of first and second control MOS-FETs 8 and 9; and a drive circuit 30 for forwarding drive signals to a control or gate terminal of first MOS-FET 1. Drive circuit 30 provides drive signals for a control or gate terminal of first MOS-FET 1 based on potentials on first and second series circuits 11 and 12. Control DC power source 10 has a positive terminal connected to first and second series circuits 11 and 12, and a negative terminal connected to a junction 6 of first and second MOS-FETs 1 and 2. Other kind of FETs such as junction field-effect transistors (J-FET) or insulated gate bipolar transistors (IGBT) may be used as first and second MOS-FETs 1 and 2 and first and second control MOS-FETs 8 and 9.

This half-bridge circuit has a trouble because reference potential of first MOS-FET 1 as a high voltage side may fluctuate between ground potential and input voltage Vin from DC power source 3 due to the on-off operation of first and second MOS-FETs 1 and 2, and to avoid such fluctuation in reference voltage, first MOS-FET 1 is driven by first control circuit 5 which involves a level shift circuit generally shown in FIG. 6. FIG. 7 indicates a time chart of voltages at selected junctions in the driving device shown in FIG. 6 wherein a junction A denotes a low potential for input voltage Vin from DC power source 3, and a junction B denotes a low potential for input voltage $V_{cc}$ from control DC power source 10.

Drive circuit 30 comprises for example an RS flip flop (RSF/F) 31 and a well-known driver (not shown) connected between RSF/F 31 and gate terminal of first MOS-FET 1. RSF/F 31 has a set input terminal S connected to a junction 36 between a first resistor 13 and a first control MOS-FET 8 through a first low pass filter 34 and a reset input terminal R connected to a junction 37 of a second resistor 14 and second control MOS-FET 9 through a second low pass filter 35. FIGS. 7 C and F indicate a threshold value as $V_{th}$ of low pass filter circuits 34 and 35.

Second MOS-FET 2 of low voltage side is driven by second control circuit 50, a well-known driver. After second MOS-FET 2 is turned off as shown in FIG. 7 A, a dead time starts to provide the simultaneous off-period for both first and second MOS-FETs 1 and 2, and thereby certainly prevent the simultaneous on-period or attain zero voltage switching (ZVS) thereof. After the time course of the simultaneous off-period, drive signal generator 7, a well-known pulse generator produces a set signal to gate signal of first control MOS-FET 8 which therefore is turned on to cause electric current to flow from control DC power source 10 through first resistor 13 and first control MOS-FET 8. At this time, a signal of low voltage at junction 36 is applied through first low pass filter 34 on set input terminal S of RSF/F 31 which therefore produces at output terminal Q an output of high voltage level to gate terminal of first MOS-FET 1 to turn it on. When drive signal generator 7 produces a reset signal R to gate terminal of second control MOS-FET 9, it is turned on to cause electric current to flow from control DC power source 10 through second resistor 14 and second control MOS-MET 9, thereby making low voltage at junction 37. Passed through second low pass filter 35 is a signal of low voltage level at junction 37 given to reset terminal R of RSF/F 31 which therefore is reset to cease output signal of high voltage level from output terminal Q to gate terminal of first MOS-FET 1 in order to turn it off. When the certain dead time has elapsed after the turning-off of first MOS-FET 1, second control circuit 50 produces a drive signal to gate terminal of second MOS-FET 2 to turn it on. Continuous repetition of the foregoing operations causes first and second MOS-FETs 1 and 2 to be alternately and iteratively turned on and off. Explanation is omitted regarding detailed methods for controlling pulse width and timing of output signals from second control circuit 50 and drive signal generator 7 and for setting dead time.

The foregoing half-bridge circuit would give rise to a rapid rise in reference voltage at junction 36 or 37 immediately after the turning-off of second MOS-FET 2 or turning-on of first MOS-FET 1 to thereby raise a large potential change dV/dt in high voltage side. At the moment, an electric current flows to electrically charge parasitic capacitances formed between drain and source terminals of first and second control MOS-FETs 8 and 9 while creating voltage drops across first and second resistors 13 and 14. Due to this, unlike under the normal operation, an abnormal signal might be fed to set or reset input terminal S or R of RSF/F 31 which therefore is led to a malfunction. In this connection, a proposal is made to the circuit of FIG. 6 that each anode terminal of first and second diodes 41 and 42 is connected between junction 6 of first and second MOS-FETs 1 and 2 and negative terminal of control DC power source 10; each cathode terminal of first and second diodes 41 and 42 is connected respectively to first and second control MOS-FETs 8 and 9. This proposal contemplates that parasitic capacitances or any negative potentials in first and second control MOS-FETs 8 and 9 are rapidly charged through first and second diodes 41 and 42 to control such negative potentials appeared in first and second series circuits 11 and 12 of first control circuit 5.

Upon occurrence of rapid potential rise dV/dt, voltage drops across first and second resistors 13 and 14 disadvantageously impede electric current flow to charge parasitic capacitances in first and second control MOS-FETs 8 and 9, and such insufficient charge in parasitic capacitances still causes malfunction of RSF/F 31. Meanwhile, noise may be produced due to the on-off operation of first and second MOS-FETs 1 and 2 or first and second control MOS-FETs 8 and 9, and exogenous noise may be superimposed on signals passing through first or second series circuit 11 or 12. To overcome such a trouble, the circuit shown in FIG. 6 comprises first and second low pass filters 34 and 35 connected respectively between junctions 36 and 37 and set and reset terminals S and R of RSF/F 31 to filter out by first and second low pass filters 34 and 35 noises of micro pulse width derived from unexpected voltage drop applied on first and second resistors 13 and 14 for prevention of malfunction in RSF/F 31. The following Patent Document 1 discloses a gate driver having a pulse filter for preventing a circuit malfunction at the time of occurrence of potential rise dV/dt.

However, the circuit shown in FIG. 6 is still disadvantageous because it needs first and second low pass filters 34, 35 of lower cutoff frequency to remove low frequency components of potential rise dV/dt. As well as contingent noises by potential rise dV/dt, first and second low pass filters 34, 35 removes high frequency components in regular signals through first and second control MOS-FETs 8 and 9, and therefore, drive signal generator 7 has to produce signals of widened pulse width. By way of example, if first and second control MOS-FETs 8 and 9 comprise constant current circuits for a few milliamperes, and input voltage $V_{in}$ of 400 volts is applied from control DC power source 10 on first and second control MOS-FETs 8 and 9, first control circuit 5 incurs a great power loss during signal transmission because the main power loss is expressed by a formula: $[(V_{in}+V_{cc})$*(a few milliamperes)*(pulse width)]. In this way, extension of pulse width obviously increases power loss, and may be in danger of inviting efficiency reduction in power control and damage or destroy of first control circuit 5.

On the other hand, in place of pulse filters, the following Patent Document 2 demonstrates a level shift circuit which comprises a first NOR circuit having a first input terminal connected between a first resistor and a first control switching element through two NOT circuits, and a second input terminal connected between a second resistor and a second switching element through another NOT circuit; and a second NOR circuit having a first input terminal connected between the first resistor and first control switching element through still another NOT circuit, and a second input terminal connected between the second resistor and second control switching element through further two NOT circuits. This level shift circuit utilizes voltage drops across first and second resistors to create regular and protective output signals from first and second resistors so that the protective signal from first resistor is used to inhibit an abnormal signal which may become a disturbing regular signal from second resistor, and adversely the protective signal from second resistor is used to inhibit an abnormal signal which may become a disturbing regular signal from first resistor.

[Patent Document 1] Japanese Patent No. 3,092,862 (FIG. 3)

[Patent Document 2] Japanese Patent Disclosure No. 2000-252809 (FIG. 1)

DISCLOSURE OF INVENTION

Problem to be Solved by Invention

However, this level shift circuit is defective in that incorporated NOT circuits disadvantageously delay and make arrival inversion of input signals to first and second input terminals of NOR circuits, and there would be a risk of incorrectly supplying contingent signals to RSF/F because abnormal signals of drastically changing pulse shorten the difference in entry time of input signals to first and second input terminals of first or second NOR circuit. In this way, the level shift circuit has a fault affected by pulse waveforms of abnormal signals.

Accordingly, it is an object of the present invention to provide a device for driving switching elements capable of preventing malfunction of a circuit by abnormal signals to perform the correct operation of the circuit.

Means for Solving the Problem

The device for driving switching elements according to the present invention, comprises a DC power source (3); first and second switching elements (1, 2) connected in series to DC power source (3) to be alternately turned on and off, an electric load (4) connected between a junction (6) of first and second switching elements (1, 2) and DC power source (3); and first and second control circuits (5, 50) connected respectively to control terminals of first and second switching elements (1, 2). First control circuit (5) comprises a control DC power source (10); a first series circuit (11) which includes a first resistor (13) and a first control switching element (8) connected in series to control DC power source (10); a second series circuit (12) which includes a second resistor (14) and a second control switching element (9) connected in parallel to first series circuit (11) and in series to control DC power source (10); a drive signal generator (7) for forwarding drive signals for each control terminal of first and second control switching elements (8, 9); and a drive circuit (30) for forwarding drive signals for a control terminal of first switching element (1) depending on potentials in first and second series circuits (11, 12). First series circuit (11) comprises a third resistor (15) connected between first resistor (13) and first control switching element (8), and second series circuit (12) comprises a fourth resistor (16) connected between second resistor (14) and second control switching element (9). A potential detector (29) provides drive circuit (30) with signals in response to differences among potentials at junctions (17 to 20) of first and third resistors (13, 15), third resistor (15) and first control switching element (8), second and fourth resistors (14, 16) and fourth resistor (16) and second control switching element (9). First to fourth resistors (13 to 16) of each suitable resistance value provide distinct potential differences among junctions (17 to 20) so that potential detector (29) precisely detects the potential at each junction (17 to 20) to produce detection signals and prevent malfunction of drive circuit (30) even upon occurrence of abnormal signals or noises resulted from abrupt potential rise.

EFFECT OF INVENTION

The present invention provides the device reliable in operation capable of preventing false operation of the device with low power loss to drive switching elements.

EXPLANATION OF SYMBOLS

1 . . . a first MOS-FET (a first switching element), 2 . . . second MOS-FET (a second switching element), 3 . . . a DC power source, 4 . . . an electric load, 5 . . . a first control circuit, 6 . . . a junction, 7 . . . a drive signal generator, 8 . . . a first control MOS-FET (a first control switching element), 9 . . . a second control MOS-FET (a second control switching element), 10 . . . a control DC power source, 11 . . . a first series circuit, 12 . . . a second series circuit, 13 . . . a first resistor, 14 . . . a second resistor, 15 . . . a third resistor, 16 . . . a fourth resistor, 17 to 20 . . . junctions, 21 . . . a first potential detector, 22 . . . a second potential detector, 23 . . . a first comparator, 24 . . . a second comparator, 25 . . . a first exclusive OR circuit, 26 . . . a second exclusive OR circuit, 29 . . . a potential detector, 30 . . . a drive circuit, 32, 33 . . . filter circuits, 50 . . . a second control circuit,

BEST MODE FOR CARRYING OUT THE INVENTION

Figure 3:
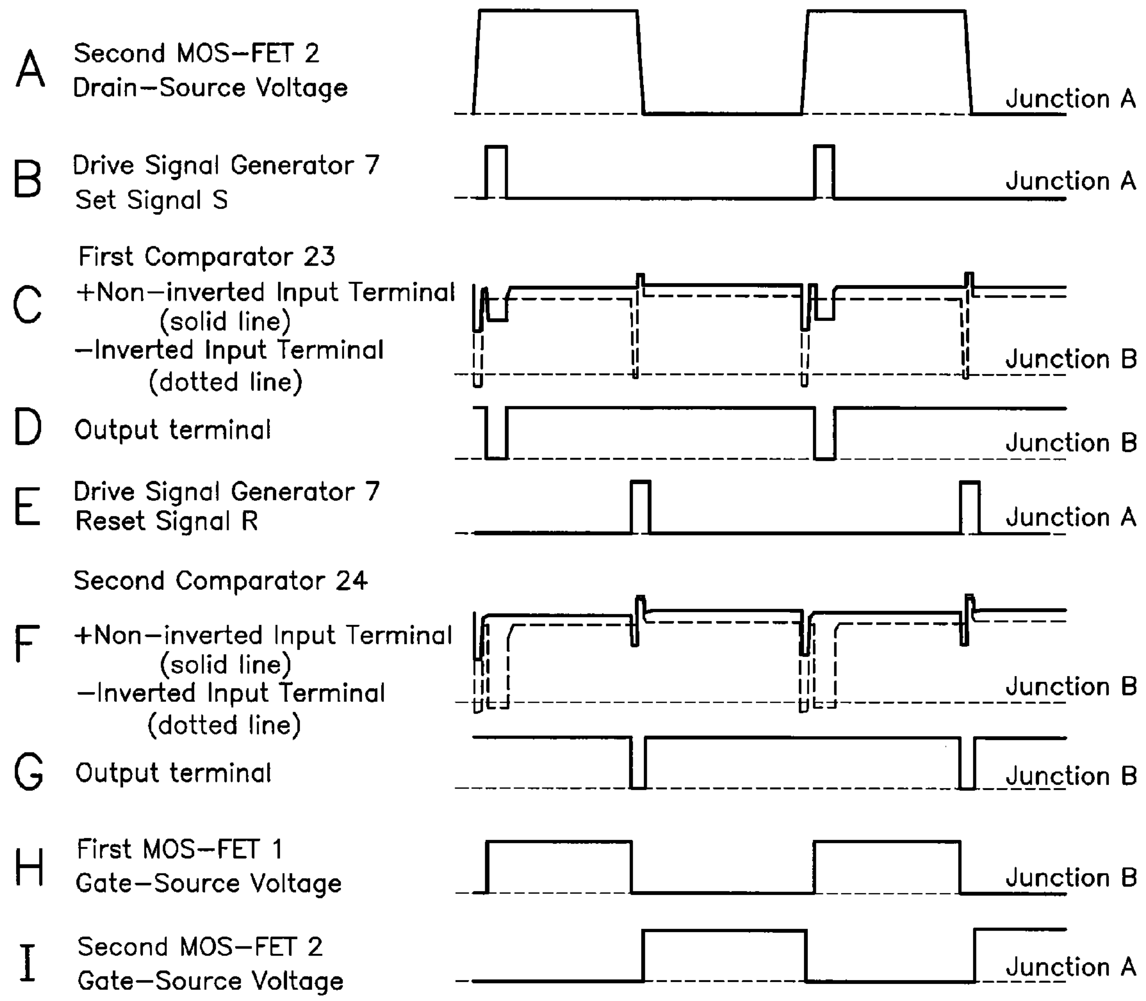
FIG. 3 A signal waveform diagram showing voltages at selected junctions in FIG. 1.
Figure 4:
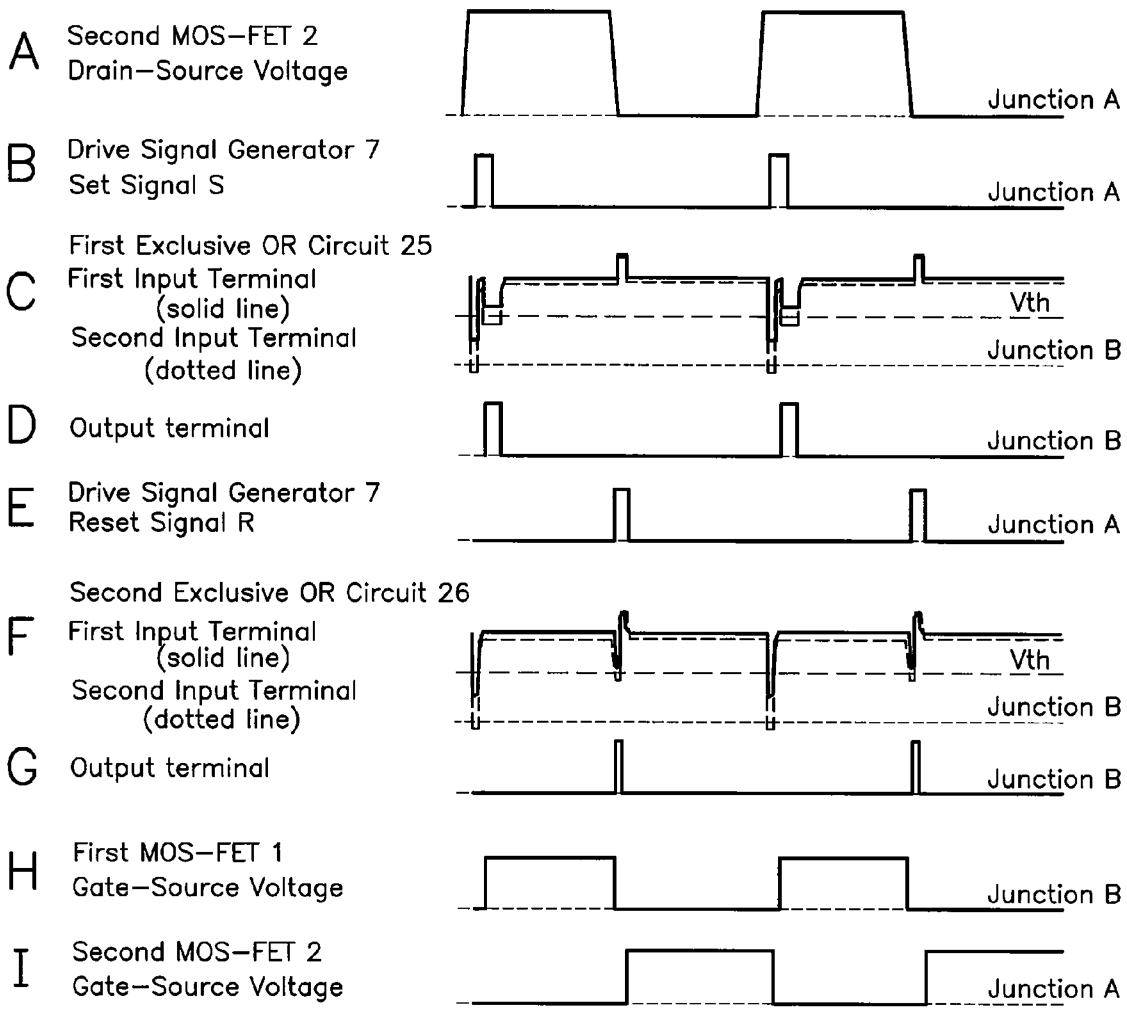
FIG. 4 A signal waveform diagram showing voltages at selected junctions in FIG. 2.
Figure 5:
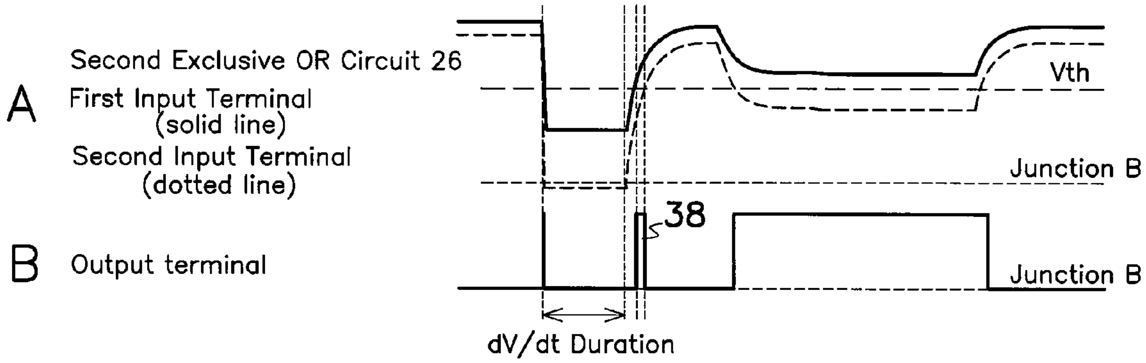
FIG. 5 A signal waveform diagram showing noise evacuated from a second exclusive OR circuit when a second MOS-FET is turned off.
Figure 6:
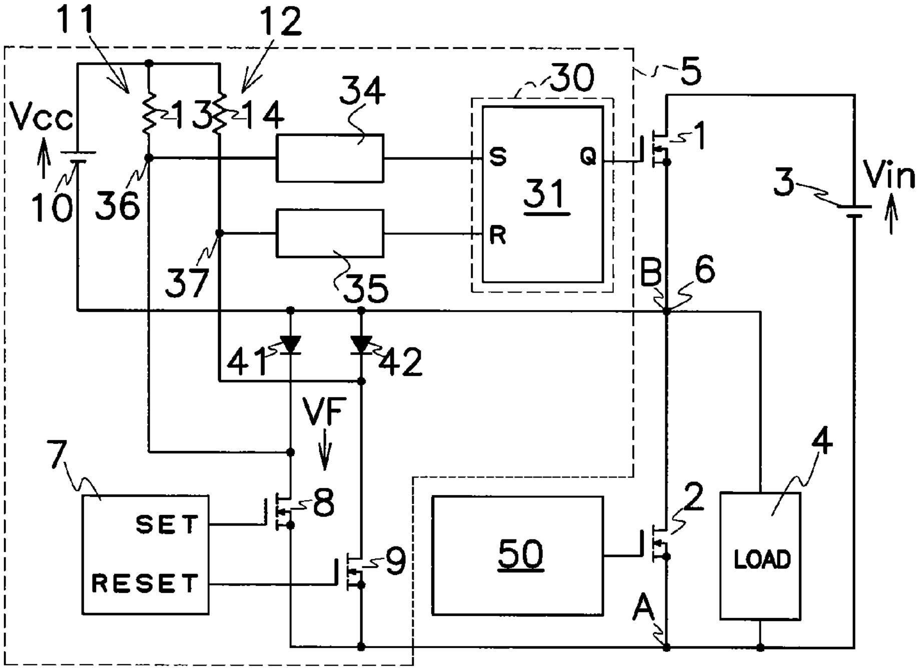
FIG. 6 An electric circuit diagram of a prior art driving device.
Figure 7:
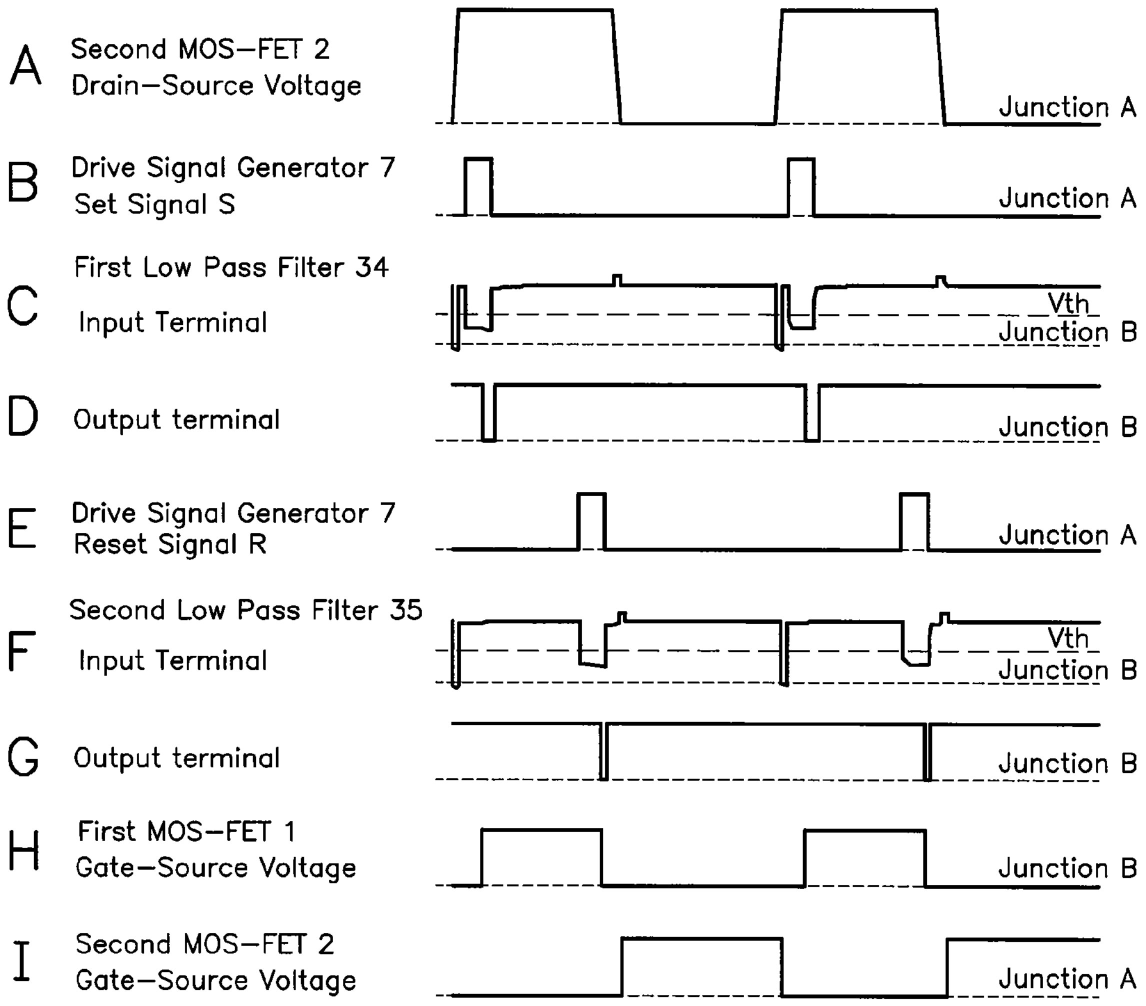
FIG. 7 A signal waveform diagram showing voltages at selected junctions in FIG. 6.

Embodiments of the driving device according to the present invention are described hereinafter in connection with FIGS. 1 to 5 of the drawings. Same reference symbols as those in FIGS. 6 and 7 are applied to denote substantially similar components in FIGS. 1 to 5 to those in FIGS. 6 and 7, and explanation thereon is omitted. Also, description is omitted regarding timing of well-known pulse signal outputs produced from second control circuit 50 and drive signal generator 7. FIGS. 3 and 4 are signal waveform diagrams showing voltages at selected junctions in FIGS. 1 and 2 wherein, similarly to FIG. 6, junctions A and B denote respectively low potentials for input voltages $V_{in}$ from DC power source 3 and $V_{cc}$ from control DC power source 10.

Figure 1:
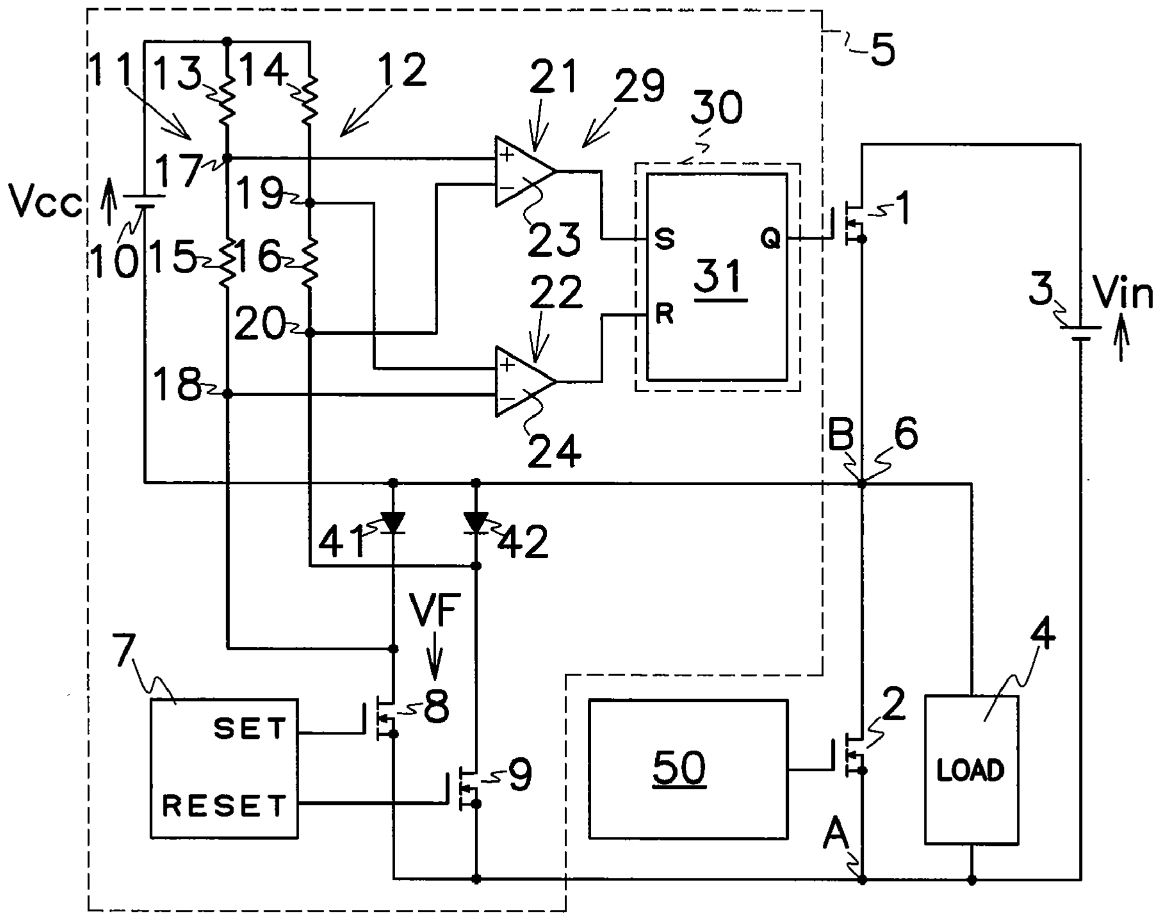
FIG. 1 An electric circuit diagram showing a first embodiment of the device according to the present invention.
Figure 2:
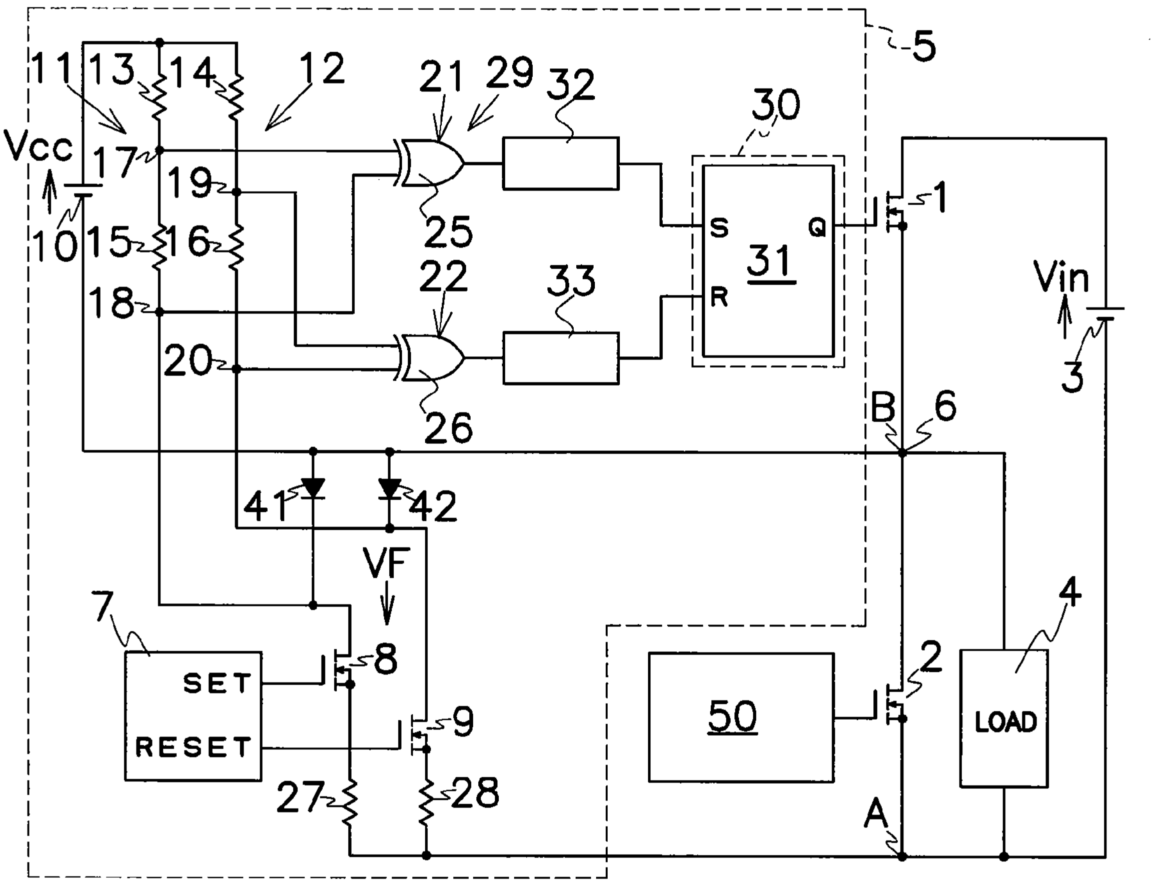
FIG. 2 An electric circuit diagram showing a second embodiment of the device according to the present invention.

As shown in FIGS. 1 and 2, the present invention is directed to a device of half-bridge type for driving an electric load 4 such as a switching power source, inverter, solenoid or the like similarly to prior art ones. However, unlike prior art driving device shown in FIG. 6, first series circuit 11 comprises a third resistor 15 connected between first resistor 13 and first control MOS-FET 8 as a first control switching element, and second series circuit 12 comprises a fourth resistor 16 connected between second resistor 14 and second control MOS-FET 9 as a second control switching element.

A first embodiment of the invention shown in FIGS. 1 and 3 has a potential detector 29 which comprises first and second potential detectors 21 and 22. First potential detector 21 comprises a first comparator 23 for comparing a potential at junction 17 of first and third resistors 13 and 15 with a potential at junction 20 of fourth resistor 16 and second control MOS-FET 9. Second potential detector 22 comprises a second comparator 24 for comparing a potential at second and fourth resistors 14 and 19 with a potential at junction 18 of third resistor 15 and first control MOS-FET 8. As shown in FIG. 1, first comparator 23 has a non-inverted input terminal connected to junction 17 of first and third resistors 13 and 15 and an inverted input terminal connected to junction 20 of fourth resistor 16 and second control MOS-FET 9. Second comparator 24 has a non-inverted input terminal connected to junction 19 of second and fourth resistors 14 and 19 and an inverted input terminal connected to junction 18 of third resistor 15 and first control MOS-FET 8. Inverted input terminals of first and second comparators 23 and 24 are connected respectively through first and second diodes 41 and 42 to junction B which provides a reference potential of high voltage side by internal input impedance or external resistor not shown.

Each of first to fourth resistors 13 to 16 has a suitable resistance value to keep the potential at junction 18 of third resistor 15 and first control MOS-FET 8 lower than the potential at junction 19 of second and fourth resistors 14 and 16, and also keep the potential at junction 20 of fourth resistor 16 and second control MOS-FET 9 lower than the potential at junction of first and third resistors 13 and 15 when both first and second MOS-FETs 8 and 9 are simultaneously in the off condition. Also, when first control MOS-FET 8 is in the on condition, the potential at junction 17 of first and third resistors 13 and 15 is retained lower than the potential at junction 20 of fourth resistor 14 and second control MOS-FET 9, and concurrently, the potential at junction 19 of second and fourth resistors 14 and 16 is maintained lower than the potential at junction 18 of third resistor 15 and first control MOS-FET 8.

As the first embodiment is provided with first series circuit 11 of first and third resistors 13 and 15 and first control MOS-FET 8 connected in series to each other, junctions 17 and 18 can have their different potentials during the off-period of second control MOS-FET 9. Likewise, as second series circuit 12 has second and fourth resistors 14 and 16 and second control MOS-FET 9 connected to each other, when second control MOS-FET 9 is turned on during the off-period of first control MOS-FET 8, junctions 19 and 20 can have their different potentials. Accordingly, first comparator 23 can correctly compare the potentials at junctions 18 and 19 to produce an output to drive circuit 30 for proper operation of drive circuit 30 at precise timing.

Drive signal generator 7 alternately turns first and second control MOS-FETs 8 and 9 on or off. During no signaling period of drive signal generator 7, in other words, during the interspacing period between set and reset signals from drive signal generator 7 shown in FIGS. 3 B and E, the potential at non-inverted input terminal is higher than the potential at inverted input terminal in both first and second comparators 23 and 24 which therefore maintain output signals of high voltage level as shown in FIG. 3 without switching first MOS-FET 1. By way of example, assuming that each resistance value of first to fourth resistors 13 to 16 is equally R, and input impedance or external resistance is 8R, during no signaling period of drive signal generator 7, control DC power source 10 applies voltage $9/10*V_{cc}$ on each non-inverted input terminal of first and second comparators 23 and 24, and also voltage $8/10*V_{cc}$ on each inverted input terminal of first and second comparators 23 and 24 which therefore maintain respective output signals of high voltage level.

Electric current values through first and second control MOS-FETs 8 and 9 are so set that each sum of voltage drops across first and third resistors 13 and 15 and of voltage drops across second and fourth resistors 14 and 16 comes to input voltage $V_{cc}$. When drive signal generator 7 produces a set signal to gate terminal of first control MOS-FET 8 which therefore is turned on, voltage at non-inverted input terminal of first comparator 23 becomes $1/2*V_{cc}$ which is lower than $8/10*V_{cc}$ at inverted input terminal to cause first comparator 23 to shift its output signal to low voltage level. At this time, coincidentally, voltage at inverted input terminal of second comparator 24 changes to zero volt, however, second comparator 24 maintains output signal of high voltage level, leaving the current high and low potential level correlation between inverted and non-inverted input terminals of second comparator 24. Accordingly, RSF/F 31 produces at output terminal Q an output signal of high voltage level to gate terminal of first MOS-FET 1 which is turned on.

Then, drive signal generator 7 issues a reset signal R to gate terminal of second control MOS-FET 9 which therefore is turned on to make the potential at junction 19 low voltage level so that second comparator 24 produces at output terminal Q an output of low voltage level. In the contrast thereto, there is no change in potential level correlation between inverted and non-inverted input terminals of first comparator 23 which therefore produces output signal of high voltage level to cause RSF/F 31 to switch output signal from high to low voltage level and turn first MOS-FET 1 off. Upon occurrence of rapid potential rise dV/dt which fluctuates reference potential at high voltage side of junction B, each non-inverted input terminal of first and second comparators 23 and 24 comes to $(V_{cc}-V_F)*1/2$. Here, $V_F$ means each voltage drop across first and second control MOS-FETs 8 and 9 in the forward direction. At the same time, each inverted input terminal of first and second comparators 23 and 24 comes to a voltage value at junction B minus $V_F$, and in any event, there is no change in high and low voltage relationship between inverted and non-inverted terminals of first and second comparators 23 and 24 so that no incorrect signal is applied to RSF/F 31 to completely prevent malfunction of RSF/F 31 in case of dV/dt.

A second embodiment of the present invention shown in FIGS. 2 and 4 comprises first and second exclusive OR circuits 25 and 26 which respectively provide first and second potential detectors 21 and 22. First exclusive OR circuit 25 comprises a first input terminal connected to junction 17 of first and third resistors 13 and 15, and a second input terminal connected to junction 18 of third resistor 15 and first control MOS-FET 8. Second exclusive OR circuit 26 comprises a first input terminal connected to junction 19 of second and fourth resistors 14 and 16, and a second input terminals connected to junction 20 of fourth resistor 16 and second control MOS-FET 9.

If each proper resistance or ohmic value is assigned to first to fourth resistors 13 to 16 to send electric current of a proper current value therethrough during the conductive period of first and second MOS-FETs 8 and 9, input signals of high voltage level can be applied to all of input terminals of first and second exclusive OR circuits 25 and 26 when first and second control MOS-FETs 8 and 9 are in the off condition, and when first control MOS-FET 8 is turned on, the potential level at junction 17 of first and third resistors 13 and 15 is higher than a threshold level of first exclusive OR circuit 25, and the potential level at junction 18 of third resistor 15 and first control MOS-FET 8 is lower than a threshold level of first exclusive OR circuit 25. Also, when second control MOS-FET 9 is turned on, the potential level at junction 19 of second and fourth resistors 14 and 16 can be higher than a threshold level of second exclusive OR circuit 26, and the potential level at junction 20 of fourth resistor 16 and second control MOS-FET 9 can be lower than a threshold level of second exclusive OR circuit 26. In addition, when both potential levels at junction 18 of third resistor 15 and first control MOS-FET 8 and at junction 20 of fourth resistor 14 and second control MOS-FET 9 are approximately equal to potential at drain terminal of first MOS-FET 1, all input terminals of first and second exclusive OR circuits 25 and 26 can be of low voltage level.

The second embodiment permits the correctly timely operation of drive circuit 30 since first exclusive OR circuit 25 compares the potentials at junctions 17 and 18 with its input threshold to produce its output to drive circuit 30, and second exclusive OR circuit 26 compares the potentials at junctions 19 and 20 with its input threshold to produce its output to drive circuit 30.

Also, the second embodiment contemplates connection of filter circuits 32 and 33 respectively between first and second exclusive OR circuits 25 and 26 and drive circuit 30. Electric current flows through second MOS-FET 2 as a second switching element when it is turned on, and is diverted from second MOS-FET 2 when it is turned off, and flows through parasitic capacitances not shown in first and second control MOS-FETs 8 and 9 to electrically charge the capacitances. Accordingly, voltage levels on first to fourth resistors 13 to 16 are once lowered, and then, again rise above the input threshold levels of first and second exclusive OR circuits 25 and 26 as shown in FIG. 5 A. At the moment, there occurs a time lag between the timings of input voltage waveforms exceeding the threshold values of first and second exclusive OR circuits 25 and 26 due to voltage division by first to fourth resistors 13 to 16 as shown in FIG. 5, and filter circuits 32 and 33 can filter out a harmful narrow pulse or noise 38 developed from first and second exclusive OR circuits 25 and 26. Narrow pulse 38 appears with the very short span at the commencement and termination of the period for charging parasitic capacitances in first and second control MOS-FETs 8 and 9 or at rising and trailing edges of voltages on first and second input terminals of first and second exclusive OR circuits 25 and 26, and therefore, it can be eliminated with filter circuits 32 and 33 which comprises a integration circuit configured with a capacitor of small capacitance and a resistor without considerable delay of proper signals through filter circuits 32 and 33. Compared to prior art low pass filters covering the entire duration of dV/dt, filter circuit 32 and 33 may beneficially remove an undesirable pulse of the extremely high cutoff frequency, and be comprised of a circuit or circuits which have much least impact on pulse width of proper signals.

Moreover, the second embodiment also contemplates utilization of constant current elements 27 and 28 such as resistors connected to source terminals of first and second control MOS-FETs 8 and 9 to drive them with constant current. Constant current elements 27 and 28 serve to maintain constant current values of electric current flows through first and third resistors 13 and 15, first control MOS-FET 8 and constant current element 27, and through second and fourth resistors 14 and 16, second control MOS-FET 9 and constant current element 28 while stabilizing each voltage on first to fourth resistors 13 to 16 for correct operation of the circuit. Also, this expands the flexibility of setting resistance values of first to fourth resistors 13 to 16.

Specifically, an exemplified constant current circuit of FIG. 2 utilizes each input threshold value of first and second exclusive OR circuits 25 and 26 as $1/2*V_{cc}$, each ratio in resistance values of third and first resistors 15 and 13 and of fourth and second resistors 16 and 14 both as 4 to 6, and each voltage drop across composite resistances of first and third resistors 13 and 15 and of second and fourth resistors 14 and 16 as $3/5*V_{cc}$ when each of first and second control MOS-FETs 8 and 9 is turned on. FIG. 4 indicates the threshold value of exclusive OR circuits as $V_{th}$. Drive signal generator 7 produces a set signal S to gate terminal of first control MOS-FET 8 which therefore is turned on to cause electric current to flow from control DC power source 10 through first and third resistors 13 and 15, first control MOS-FET 18 and constant current element 27, while voltage drops emerge across first and third resistors 13 and 15 so that in accordance with the foregoing setting of voltages, $(V_{cc}-3/5*V_{cc})=2/5*V_{cc}$ is applied on junction 18 of third resistor 15 and first control MOS-FET 8 to apply low voltage signal to first input terminal of first exclusive OR circuit 25. In contrast thereto, since resistance ratio of third and first resistors 15 and 13 is 4 to 6, $(V_{cc}-3/5*6/10*V_{cc})=16/25*V_{cc}$ is applied on junction 17 of first and third resistors 13 and 15 to apply high voltage signal to second input terminal of first exclusive OR circuit 25 which therefore inverts output signal to turn first MOS-FET 1 on.

Likewise, when drive signal generator 7 produces reset signal R to gate terminal of second MOS-FET 9, signals of high and low voltage levels are supplied to respectively first and second input terminals of second exclusive OR circuit 26 to turn first MOS-FET 1 off. When potential rise dV/dt occurs at junction A of low reference potential upon rising edge of pulse signal from second control circuit 50 to gate terminal of second MOS-FET 2, voltage at junction A is clamped at a level lower than reference potential at junction B by forward voltage drop $V_F$, thereby causing low voltage level at junction 18 of third resistor 15 and first control MOS-FET 8 and junction 20 of fourth resistor 16 and second control MOS-FET 9. At this time, both junction 17 of first and third resistors 13 and 15 and junction 19 of second and fourth resistors 14 and 16 come to a level: $(V_{cc}-V_F)*4/10$ to supply signals of low voltage level at first and second input terminal of first and second exclusive OR circuits 25 and 26. Accordingly, first and second exclusive OR circuits 25 and 26 do not invert their output voltage level to prevent first MOS-FET 1 from unfavorably being turned on, and thereby inhibit an abnormal signal upon occurrence of undesirable potential rise dV/dt.

Assuming that each of third and fourth resistors 15 and 16 has a same resistance value: 4R, each of first and second resistors 13 and 14 has a same resistance value: 6R, constant current element 27 provides a constant: 3/5, and electric current flowing through first and second MOS-FETs 8 and 9 has a value i, the following equation is expressed:

$$i*10R=V_{cc}*3/5$$

Therefore, electric current i is derived as follows:

$$i=V_{cc}*3/50R$$

The foregoing example exhibits constant current element 27 for providing a constant: 3/5 in view of voltage drop of $V_{cc}*3/5$ during the conductive period of first and second control MOS-FETs 8 and 9. In this connection, a similar consequence may be established if suitable resistance radio and current value are such selected that input signal of low voltage level is supplied to only one of first and second input terminals of first and second exclusive OR circuits 25 and 26 during the conductive period of first and second control MOS-FETs 8 and 9, and also input signals of low voltage level are furnished to both of first and second input terminals of first and second control MOS-FETs 8 and 9 upon occurrence of potential rise dV/dt.

As mentioned above, first and second potential detectors 21 and 22 provide signals for drive circuit 30 in response to differential in potential among junction 17 of first and third resistors 13 and 15, junction 18 of third resistor 15 and first control MOS-FET 8, junction 19 of second and fourth resistors 14 and 16 and junction 20 of fourth resistor 16 and second control MOS-FET 9. First and second potential detectors 21 and 22 can correctly pick out voltages at junctions of first to fourth resistors 13 to 16. Setting of suitable or proper resistance values for first to fourth resistors 13 to 16 can provide distinct potential differences among junctions 17 to 20 upon rapid potential rise dV/dt at junctions 17 to 20 so that first and second potential detectors 21 and 22 can certainly discern the potentials at junctions 17 to 20 to produce output signals so as to prevent malfunction of drive circuit 30 even in case of emergence of abruptly changing pulse due to potential rise. Also, the driving device of the present invention does not need low pass filters which disadvantageously may eliminate even proper signals due to the on-off operation of first and second control MOS-FETs 8 and 9 as in prior art. In addition, even though drive signal generator 7 produces drive signals of wider pulse width to gate terminal of first and second control MOS-FETs 8 and 9, the device is subject to no further power loss.

INDUSTRIAL APPLICABILITY

The present invention is more preferably applicable to driving devices for controlling an electric load driven under high voltage utilizing control signals of low voltage level.

What is claimed is:

1. A device for driving switching elements comprising:

a DC power source;

first and second switching elements connected in series to the DC power source to be alternately turned on and off;

an electric load connected between a junction of the first and second switching elements and DC power source; and first and second control circuits connected respectively to control terminals of the first and second switching elements;

the first control circuit comprising:

a control DC power source;

a first series circuit which includes a first resistor and a first control switching element connected in series to the control DC power source;

a second series circuit which includes a second resistor and a second control switching element connected in parallel to the first series circuit and in series to the control DC power source;

a drive signal generator for forwarding drive signals for each control terminal of the first and second control switching elements;

a drive circuit for forwarding drive signals for a control terminal of the first switching element depending on potentials in the first and second series circuits; and a potential detector;

wherein the first series circuit comprises a third resistor connected between the first resistor and first control switching element;

the second series circuit comprises a fourth resistor connected between the second resistor and second control switching element;

the potential detector provides drive circuit with signals in response to differences among potentials at junctions of first and third resistors, third resistor and first control switching element, second and fourth resistors and fourth resistor and second control switching element;

the potential detector comprises first and second potential detectors;

the first potential detector comprises a first comparator for comparing a potential at a junction of the first and second resistors with a potential at a junction of the fourth resistor and second control switching element; and the second potential detector comprises a second comparator for comparing a potential at a junction of the second and fourth resistors with a potential at a junction of the third resistor and first control switching element.

2. The device of claim 1, wherein the first and second control switching elements are driven with constant current.

3. The device of claim 1, wherein the drive signal generator alternately turns the first and second control switching elements on and off.

4. A device for driving switching elements comprising:

a DC power source;

first and second switching elements connected in series to the DC power source to be alternately turned on and off;

an electric load connected between a junction of the first and second switching elements and DC power source; and first and second control circuits connected respectively to control terminals of the first and second switching elements;

the first control circuit comprising:

a control DC power source;

a first series circuit which includes a first resistor and a first control switching element connected in series to the control DC power source;

a second series circuit which includes a second resistor and a second control switching element connected in parallel to the first series circuit and in series to the control DC power source;

a drive signal generator for forwarding drive signals for each control terminal of the first and second control switching elements;

a drive circuit for forwarding drive signals for a control terminal of the first switching element depending on potentials in the first and second series circuits; and a potential detector;

wherein the first series circuit comprises a third resistor connected between the first resistor and first control switching element;

the second series circuit comprises a fourth resistor connected between the second resistor and second control switching element;

the potential detector provides drive circuit with signals in response to differences among potentials at junctions of first and third resistors, third resistor and first control switching element, second and fourth resistors and fourth resistor and second control switching element;

the potential detector comprises first and second potential detectors;

the first potential detector comprises a first exclusive OR circuit which includes a first input terminal connected to a junction of the first and third resistors and a second input terminal connected to a junction of the third resistor and first control switching element; and the second potential detector comprises a second exclusive OR circuit which includes a first input terminal connected to a junction of the second and fourth resistors and a second input terminal connected to a junction of the fourth resistor and second control switching element.

5. The device of claim 4, further comprising filter circuits connected between the first exclusive OR circuit and drive circuit and between the second exclusive OR circuit and drive circuit.

6. The device of claim 4, wherein the first and second control switching elements are driven with constant current.

7. The device of claim 4, wherein the drive signal generator alternately turns the first and second control switching elements on and off.

* * * * *